(12) United States Patent
Hong et al.

(10) Patent No.: US 11,404,387 B2
(45) Date of Patent: Aug. 2, 2022

(54) SEMICONDUCTOR CHIP

(71) Applicant: Delta Electronics (Shanghai) CO., LTD, Shanghai (CN)

(72) Inventors: Shouyu Hong, Shanghai (CN); Shili Wu, Shanghai (CN); Ganyu Zhou, Shanghai (CN); Yuan Gao, Shanghai (CN); Jinshan Shi, Shanghai (CN); Jianhong Zeng, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 29 days.

(21) Appl. No.: 16/816,298

(22) Filed: Mar. 12, 2020

(65) Prior Publication Data

US 2020/0312792 A1 Oct. 1, 2020

(30) Foreign Application Priority Data

Mar. 25, 2019 (CN) .......................... 201910228563.9

(51) Int. Cl.
*H01L 23/62* (2006.01)
*H01L 23/31* (2006.01)
(Continued)

(52) U.S. Cl.
CPC ........ *H01L 23/62* (2013.01); *H01L 21/76892* (2013.01); *H01L 23/3171* (2013.01);
(Continued)

(58) Field of Classification Search
CPC ..................................................... H01L 23/62
See application file for complete search history.

(56) References Cited

U.S. PATENT DOCUMENTS

| 4,937,646 A | 6/1990 | Tihanyi et al. |
| 8,587,033 B1 | 11/2013 | Rieger et al. |
| (Continued) | | |

FOREIGN PATENT DOCUMENTS

| CN | 102568423 B | 8/2015 |
| EP | 2937960 A1 | 10/2015 |
| (Continued) | | |

OTHER PUBLICATIONS

The 1st Office Action dated Feb. 2, 2021 by the JPO.
(Continued)

*Primary Examiner* — Omar F Mojaddedi
(74) *Attorney, Agent, or Firm* — Qinghong Xu

(57) ABSTRACT

The present disclosure provides a semiconductor chip including a functional area, a first end, a second end, a third end, and a connecting portion. The functional area has first and second sides opposite to each other. The first end is disposed on the first side and the third end is disposed on the first side, wherein the semiconductor chip is switched on or off according to the drive signal received between the third end and the first end, and the connecting portion is disposed on the first side of the functional area and connected to the first end and the third end, wherein when the temperature rises above the a first temperature, the connecting portion is in a conductive state, and when the temperature drops to be not higher than a third temperature, the connecting portion is in an insulated state.

13 Claims, 15 Drawing Sheets

(51) Int. Cl.
*H01L 23/525* (2006.01)
*H01L 27/24* (2006.01)
*H01L 29/66* (2006.01)
*H03K 17/0812* (2006.01)
*H01L 21/768* (2006.01)
*H03K 17/08* (2006.01)

(52) U.S. Cl.
CPC ...... *H01L 23/3192* (2013.01); *H01L 23/5256* (2013.01); *H03K 17/0812* (2013.01); *H03K 2017/0806* (2013.01)

(56) References Cited

U.S. PATENT DOCUMENTS

| | | | | |
|---|---|---|---|---|
| 2005/0218471 | A1* | 10/2005 | Ohkubo | H01L 23/34 374/E7.018 |
| 2014/0035003 | A1* | 2/2014 | Rieger | H01L 29/778 257/194 |
| 2016/0133620 | A1 | 5/2016 | Pedone et al. | |
| 2018/0240732 | A1* | 8/2018 | Tonedachi | H01L 23/5385 |

FOREIGN PATENT DOCUMENTS

| | | | | |
|---|---|---|---|---|
| JP | 39009140 | B | 5/1964 | |
| JP | 42024785 | B | 11/1967 | |
| JP | 2005286238 | A | 10/2005 | |
| JP | 2011524626 | A | 9/2011 | |
| JP | 2017041585 | A | 2/2017 | |
| KR | 20160092336 | A * | 8/2016 | ....... H03K 17/08104 |
| KR | 20160092336 | A | 8/2016 | |
| KR | 20180010022 | A | 1/2018 | |
| WO | 2009107993 | A2 | 9/2009 | |

OTHER PUBLICATIONS

The EESR dated Aug. 21, 2020 by the EPO.
The 2nd Office Action dated Oct. 5, 2021 for JP patent application No. 2020-048546.

* cited by examiner

SEMICONDUCTOR CHIP

CROSS-REFERENCE TO RELATED APPLICATIONS

This application is based upon and claims priority to Chinese Patent Application No. 201910228563.9, filed on Mar. 25, 2019, the entire contents thereof are incorporated herein by reference.

TECHNICAL FIELD

This disclosure relates to a technical field of an integrated circuit, and in particular to a semiconductor chip with a temperature controlled connecting portion.

BACKGROUND

With rapid development of new energy vehicles, computing equipments, autonomous driving, smart phones, requirements for power supply products for the above-mentioned fields are becoming higher and higher. A semiconductor chip is a key component for the power supply products and is widely used in switching converter circuits, power amplifier circuits, rectifier circuits and drive circuits, etc. Thus, requirement for reliability of the semiconductor chip is gradually increasing.

Generally speaking, semiconductor chips suffer from a temperature rising progress before failure due to various reasons such as short circuit, overcurrent, abnormal heat dissipation or driving abnormality. FIG. 1 is a schematic structural view of a cross-sectional structure of the conventional semiconductor chip. As shown in FIG. 1, the semiconductor chip 1', for example, can be a metal oxide semiconductor field effect transistor (MOSFET). Cells of a gate (G) and a source (S) of the semiconductor chip 1' are periodically arranged, and are connected to a respective bonding pad (not shown) by metal. A metal wiring connecting a plurality of cells with of the gate G and the source S to a bonding pad and a metal of the bonding pad are collectively referred to as a metal wiring layer. It should be particularly noted that the wiring connecting the cell of the gate G to the bonding pad generally includes such two forms as a heavily doped polysilicon and an additional metal layer on the polysilicon, which will not be described any more. And there is an interval between the gate G and the source S to provide the respective electrodes independently. When some faults occur, the temperature of the chip rises, and the metal wiring layer may melt, flow and diffuse to form a metal connecting portion M. Therefore, the molten metal spans over the interval and connects to the gate G and the source S, which causes short circuit between the gate G and the source S, and thus the semiconductor chip 1' is switched off. However, although the semiconductor chip 1' is switched off due to molten of the metal wiring layer at a high temperature, on the one hand, after returning to the normal temperature, the metal wiring layer that has been molten and solidified still makes the gate G and the source S short such that the semiconductor chip 1' cannot work normally, and on the other hand, before the high temperature fault occurs, the metal wiring layer itself is not directly connected to the gate G and the source S, but connect to the gate G and the source S due to the accidental diffusion after the metal wiring layer is molten, which is not controllable.

As a result, how to develop a semiconductor chip to overcome the above disadvantages is an urgent need at present.

SUMMARY

An object of the present disclosure is to provide a semiconductor chip to enhance utility of the semiconductor chip.

To achieve the above object, an embodiment of the present disclosure provides a semiconductor chip, which includes a functional area, a first end, a second end, a third end, and a connecting portion. The functional area has first and second sides opposite to each other. The first end is disposed on the first side. The third end is disposed on the first side, wherein the semiconductor chip is switched on or off according to a drive signal received between the third end and the first end. The connecting portion is disposed on the first side of the functional area and connected to the first end and the third end, wherein when the temperature rises above a first temperature, the connecting portion is in a conductive state, so that the semiconductor chip is switched off due to a short circuit between the first end and the third end; and when the temperature drops to be not higher than a third temperature, the connecting portion is in an insulated state, wherein the first temperature is higher than or equal to the third temperature.

To achieve the above object, another embodiment of the present disclosure provides a method used in a semiconductor chip. First, a step S1 is performed, providing a chip body that includes a functional area, a first end, a second end, and a third end. The functional area has first and second sides opposite to each other, wherein the first end and the third end are disposed on the first side, and a drive signal is received between the first end and the third end to control the semiconductor chip to be switched on or off. Next, a step S2 is performed, forming a connecting portion on the first side of the functional area and connecting the first end and the third end, wherein when a temperature of the connecting portion rises above a first temperature, the connecting portion is in a conductive state, so that the semiconductor chip is switched off due to a short circuit between the first end and the third end, and when the temperature of the connecting portion drops to be not higher than a third temperature, the connecting portion is in an insulated state, wherein the first temperature is higher than or equal to the third temperature.

Figure 1:
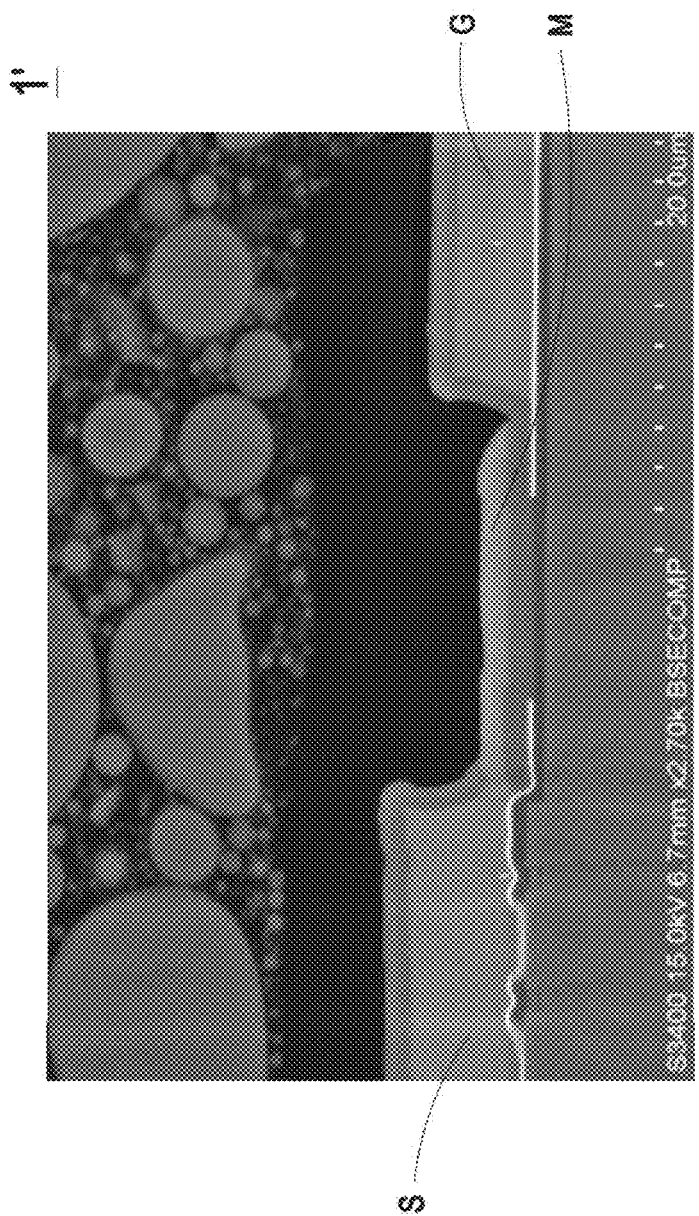
FIG. 1 is a schematic structural view of a cross-sectional structure of a conventional semiconductor chip.

Reference numbers are listed as follows:
1': semiconductor chip
G: gate
S: source
M: metal connecting portion
1, 2, 3, 4, 5, 6: semiconductor chip
10, 20, 30, 40, 50, 60: chip body
11, 21, 31, 41, 51, 61: functional area
111, 211, 311, 411, 511, 611: first side
112, 212, 312, 412, 512, 612: second side
12, 22, 32, 42, 52, 62: first end
13, 23, 33, 43, 53, 63: third end
64: polysilicon
70: insulating medium
15, 35, 45, 55: first passivation layer
25, 36, 46, 56: second passivation layer
47, 57: metal layer
D: package structure
19: second end
S1~S3: steps

DETAILED DESCRIPTION

Typical embodiments embodying features and advantages of this disclosure will be set forth below in detail. It should be understood that various modifications may be made in different embodiments without departing from the scope of this disclosure, wherein the specification and drawings in essential are used for description but not limit to this disclosure.

Figure 2:
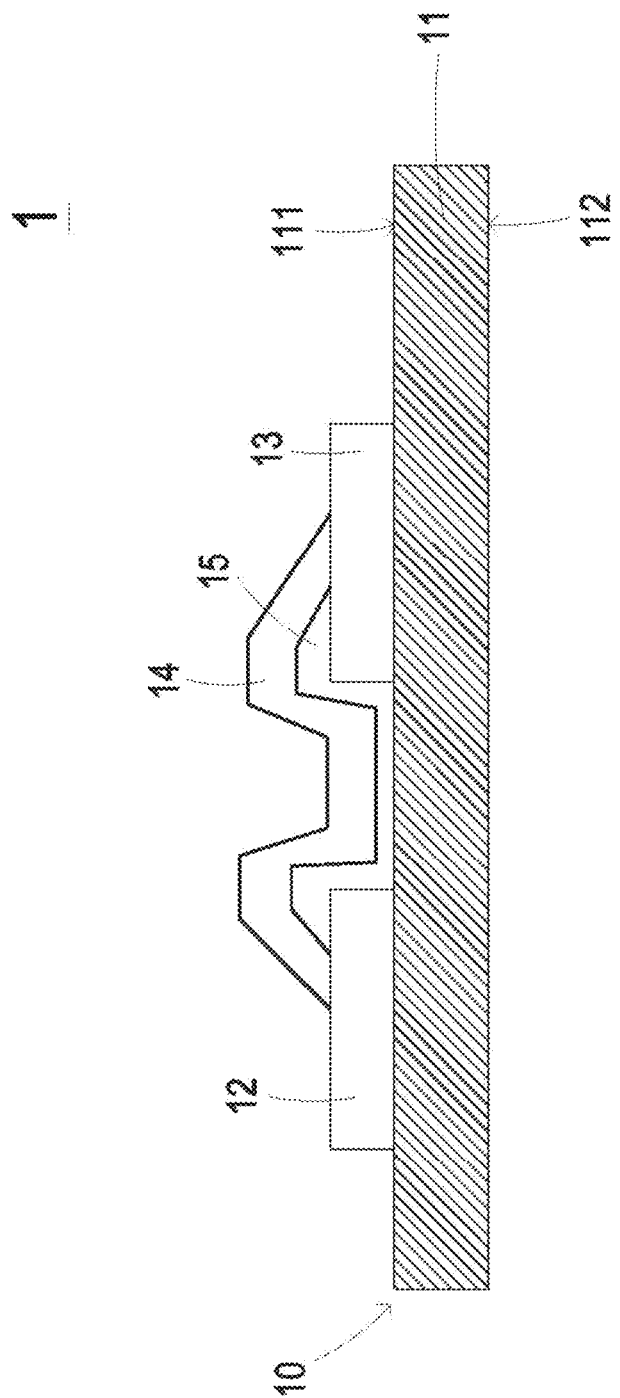
FIG. 2 is a schematic structural view of a cross-sectional structure of a semiconductor chip of a first embodiment of the present disclosure.
Figure 3:
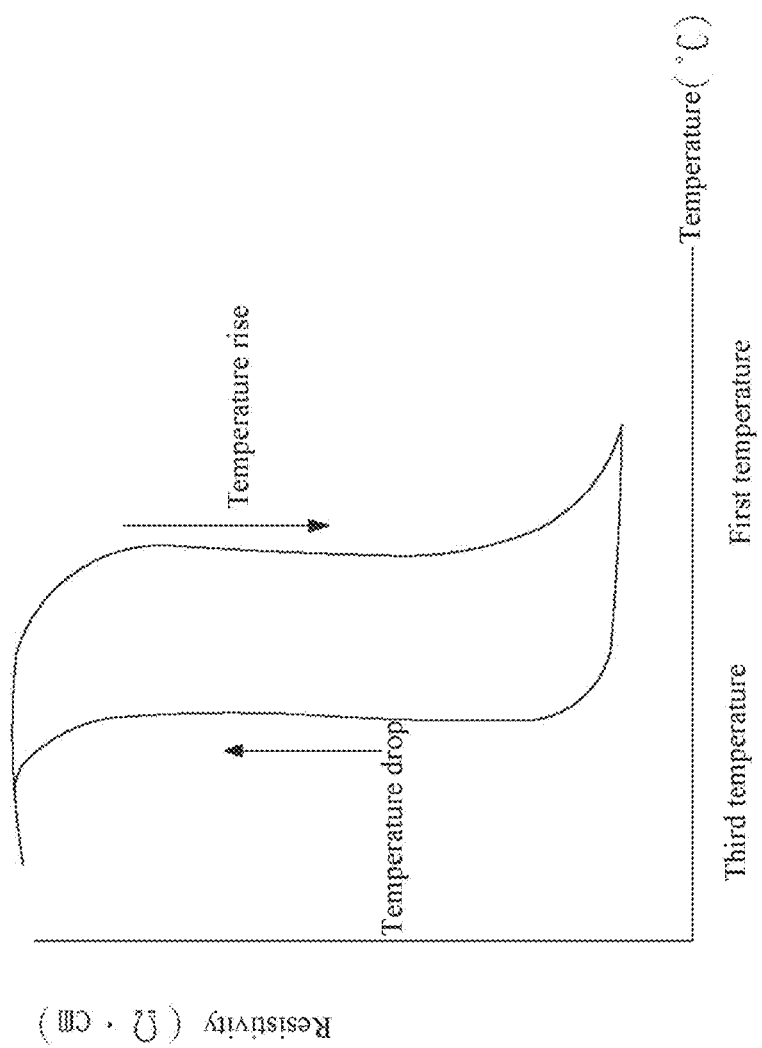
FIG. 3 is a schematic view showing changes in resistivity of a connecting portion of the semiconductor chip as shown in FIG. 2 at different temperatures.

Referring to FIGS. 2 and 3, in which FIG. 2 is a schematic view of a cross-sectional structure of a semiconductor chip of a first embodiment of the present disclosure, and FIG. 3 is a schematic diagram showing changes in resistivity of a connecting portion of the semiconductor chip as shown in FIG. 2 at different temperatures. As shown in the figures, the semiconductor chip 1 of the present disclosure is, for example but not limited to, a metal oxide semiconductor field effect transistor (MOSFET), an insulated gate bipolar transistor (IGBT), a high electron mobility transistor (HEMT) or a bipolar junction transistor (BJT), and includes a functional area 11, a first end 12, a second end (not shown), a third end 13 and a connecting portion 14. In some embodiments, a material of the semiconductor chip 1 may be, but not limited to, silicon (Si), silicon carbide (SiC), gallium nitride (GaN), or the like.

Functional area 11 includes a first side 111 and a second side 112 opposite to each other. The first end 12 is disposed on the first side 111. The first end 12 may be an output end, such as a source of a MOSFET. The functional area 11 is a semiconductor material area of the semiconductor chip 1, such as a Si material area of a Si-based device. The second end is an output end, such as a drain of a MOSFET. The third end 13 is disposed on the first side. The third end 13 is, for example, an input end, such as the gate of a MOSFET. The semiconductor chip 1 is switched on or off according to a drive signal received between the third end 13 and the first end 12, wherein the drive signal may be voltage or current. In some embodiments, the functional area 11, the first end 12, the second end, and the third end 13 may constitute a chip body 10. The connecting portion 14 is disposed on the first side 111 of the functional area 11 and is connected to the first end 12 and the third end 13. Referring to FIG. 3, when the ambient temperature of the connecting portion 14 shifts from one temperature to a new temperature because of system failure, chip failure, environmental change, etc., the temperature of the connecting portion 14 gradually becomes the new ambient temperature due to the thermal hysteresis phenomenon. For example, the connecting portion 14 is vanadium dioxide (of $VO_2$). When the temperature of the connecting portion 14 rises to a first temperature, the resistivity of the connecting portion 14 is lowered to be in a conductive state, such that the semiconductor chip 1 is switched off due to a short circuit between the first end 12 and the third end 13, which helps to prevent the temperature of the semiconductor chip from further rising to cause damage. In addition, when the temperature of the connecting portion 14 drops to a third temperature, the resistivity of the connecting portion 14 rises to be in an insulating state, at this time, the semiconductor chip 1 may be restored to normal operation, wherein the first temperature is higher than or equal to the third temperature. In some embodiments, in the event that the first temperature is equal to the third temperature, when the temperature of the connecting portion 14 drops to not higher than the first temperature, the semiconductor chip 1 is in normal operation. When the temperature of the connecting portion 14 rises above the first temperature to be in the conductive state, the semiconductor chip 1 is switched off due to the short circuit between the first end 12 and the third end 13. When the temperature of the connecting portion 14 is lowered from a temperature higher than the first temperature to a temperature not higher than the first temperature, the connecting portion 14 changes from the conductive state to the insulated state. In some of the above embodiments, the value of the first temperature and the third temperature may be related to factors such as material producing process of the connecting portion 14, material thickness of the connecting portion 14, and speed of temperature variation of the connecting portion 14 and so on.

In some embodiments, the connecting portion 14 may be, but not limited to, temperature induced phase change materials, such as vanadium dioxide ($VO_2$), vanadium dioxide doped with germanium or other elements, and other temperature induced phase change materials. The connecting portion 14 can also be a glass with low melting temperature, such as vanadate material, phosphate material, borate material or silicate material or the like. The connecting portion made of glass with low melting temperature may be, but not limited to lead oxide-zinc oxide-diboron trioxide material systems (PbO—ZnO—$B_2O_3$), lead oxide-aluminum oxide-diboron trioxide material system (PbO—$Al_2O_3$—$B_2O_3$), lead oxide-bismuth trioxide-diboron trioxide material systems (PbO—$Bi_2O_3$—$B_2O_3$), lead oxide-diboron trioxide-silicon dioxide material system (PbO—$B_2O_3$—$SiO_2$), potassium oxide-lead-silicon dioxide material system ($K_2O$—Pb—$SiO_2$), zinc oxide-diboron trioxide-silicon dioxide material system (ZnO—$B_2O_3$—$SiO_2$), lead oxide-silicon dioxide-zinc oxide-barium oxide material system (PbO—

$SiO_2$—ZnO—BaO), sodium oxide-barium oxide-silicon dioxide material system ($Na_2O$—BaO—$SiO_2$), zinc oxide-diboron trioxide-phosphorus pentoxide material systems (ZnO—$B_2O_3$—$P_2O_5$) lithium oxide-aluminum oxide-silicon dioxide material system ($Li_2O$—$Al_2O_3$—$SiO_2$), thallium oxide-vanadium pentoxide-tellurium oxide-arsenic oxide material systems ($Tl_2O$—$V_2O$—$TeO_2$—$AsO_3$), bismuth oxide-diboron trioxide material systems ($Bi_2O_3$—$B_2O_3$), lead oxide-vanadium pentoxide-bismuth oxide-zinc oxide system material (PbO—$V_2O_5$—$Bi_2O_3$—ZnO), lithium oxide-zinc oxide-silicon dioxide material system ($Li_2O$—ZnO—$SiO_2$), tin oxide-zinc oxide-phosphorus pentoxide material systems (SnO—ZnO—$P_2O_5$), vanadium pentoxide-phosphorus pentoxide-antimony oxide material system ($V_2O_5$—$P_2O_5$—SbO), etc. In addition, more other materials may be added to the above material to adjust the melting point, strength, thermal expansion coefficient, wettability, electrical properties and manufacturability.

It can be seen from the above description that when the above mentioned material is used for the connecting portion 14, the first temperature is equal to the third temperature. When the temperature of the connecting portion 14 rises to the temperature higher than the first temperature, the connecting portion 14 is in conductive state, and when the temperature of the connecting portion 14 drops to a temperature not higher than the first temperature, the connecting portion 14 is in insulating state. Thus, compared to the conventional semiconductor chip 1' that cannot work normally after returning to the normal temperature, the semiconductor chip 1 of the present disclosure can be automatically switched off at a high temperature to avoid further damage, and can be restored to work normally after returning to the normal temperature. Thus, the semiconductor chip 1 of the present disclosure has a high practicability.

In this embodiment, the semiconductor chip 1 includes a bonding pad and a metal wiring layer (not shown). The first temperature is lower than a melting temperature of the metal wiring layer (for example, the melting point of aluminum is 660° C.), and the first temperature is less than a lowest temperature at which the semiconductor chip loses semiconductor characteristics. Therefore, when the state of the connecting portion 14 changes according to the boundary of the first temperature, the metal wiring layer and the characteristics of the semiconductor chip are not affected. In addition, there is a second temperature, which is a maximum allowable junction temperature of the semiconductor chip 1 (in particular, the maximum allowable junction temperature refers to a given temperature under comprehensive consideration of performance, service life, etc., the temperature is generally lower than a limiting temperature that the semiconductor can withstand to remain the semiconductor switching characteristics). Therefore the semiconductor chip 1 can work normally when the temperature of the semiconductor chip 1 falls below the second temperature. As the second temperature is lower than the first temperature, when the semiconductor chip 1 works normally, that is, when the temperature of the semiconductor chip 1 drops to no higher than the second temperature, the connecting portion 14 is in an insulated state. Thus a short circuit between the two control electrodes (the first end 12 and the third end 13) can be avoided. In table 1 below, the maximum junction temperature, the minimum temperature for losing the semiconductor characteristics and a range of the first temperature are shown with different material types of semiconductor chips 1, which are not limited thereto.

TABLE 1

| material of semiconductor chip | maximum junction temperature (° C.) | minimum temperature for losing semiconductor characteristics (° C.) | range of first temperature (° C.) |
|---|---|---|---|
| Si | ~150-175 | <200 | ~175-200 |
| GaN | ~175-200 | >600 | ~260-600 |
| SiC | ~175-200 | >600 | ~260-600 |

Continue to refer to FIG. 2, the semiconductor chip 1 may further include a first passivation layer 15, but the disclosure is not limited thereto. The first passivation layer 15 is disposed on the first side 111 of the functional area 11 for protecting the functional area 11. The connecting portion 14 covers the first passivation layer 15, wherein the material of the first passivation layer 15 may be but not limited to silicon dioxide ($SiO_2$), silicon nitride (SiN) or polyimide (PI). Further, the first passivation layer 15 may be a composite layer such as a polyimide layer provided on silicon nitride, a silicon nitride layer composited on silicon dioxide, or the like. In this embodiment, the moisture and pollution is blocked out of the first side 111 of the functional area 11 between the first end 12 and the third end 13 by the first passivation layer 15, thus there is a relatively low requirement for the material of the connecting portion 14 to block moisture and pollution so that the structure of the semiconductor chip 1 is relatively easy to be implemented and the manufacturing method is relatively simple.

Figure 4:
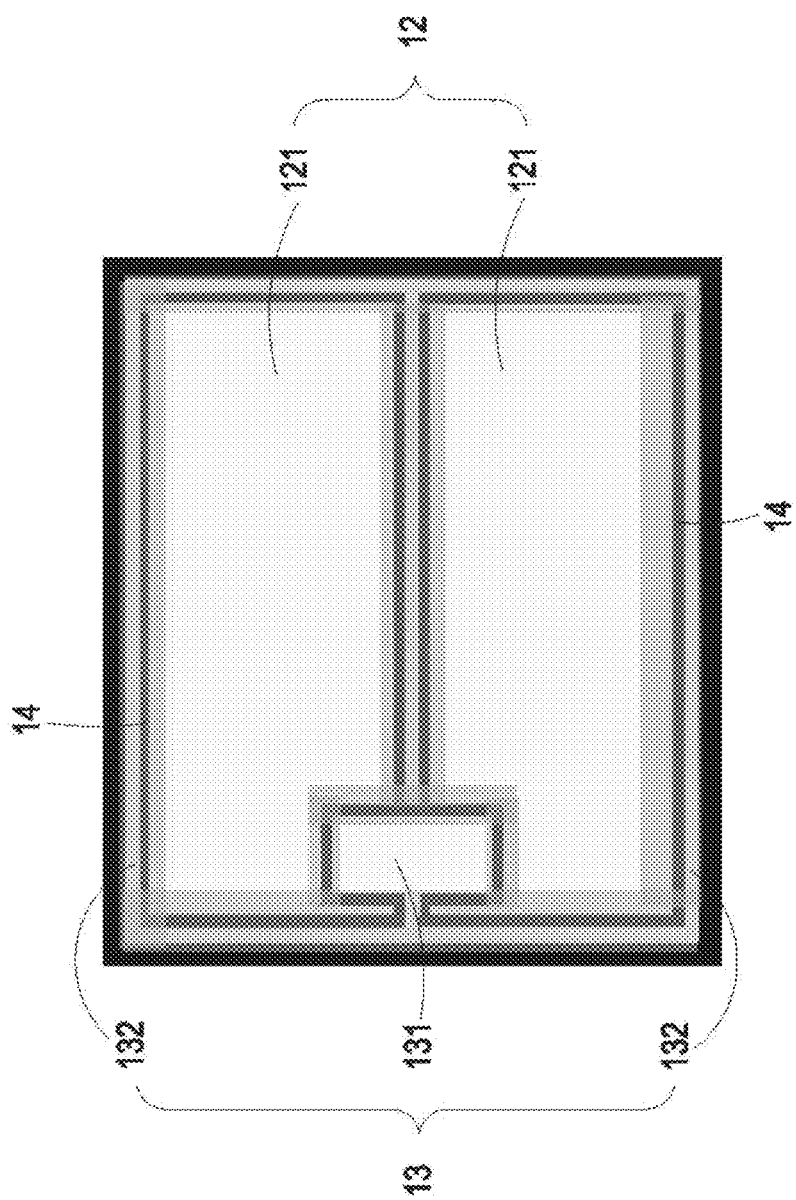
FIG. 4 is a schematic top view of a structure of an embodiment of the semiconductor chip as shown in FIG. 2.

In some embodiments, the first end 12 includes a plurality of first bonding pad 121, and the third end 13 includes a second bonding pad 131 and a second interconnect line 132. The connecting portion 14 may completely fill in a gap between the first end 12 and the third end 13 on the first side 111 of the functional area 11. As shown in FIG. 4, the connecting portion 14 completely fills in a gap between the first bonding pad 121 and the second bonding pad 131 and a gap between the first bonding pad 121 and the second interconnect line 132. Therefore when the temperature at any location of the semiconductor chip 1 rises to higher than the first temperature, the connecting portion 14 is transitioned to the conductive state, and thus, sensitivity of the state transition of the semiconductor chip 1 is higher.

Figure 5:
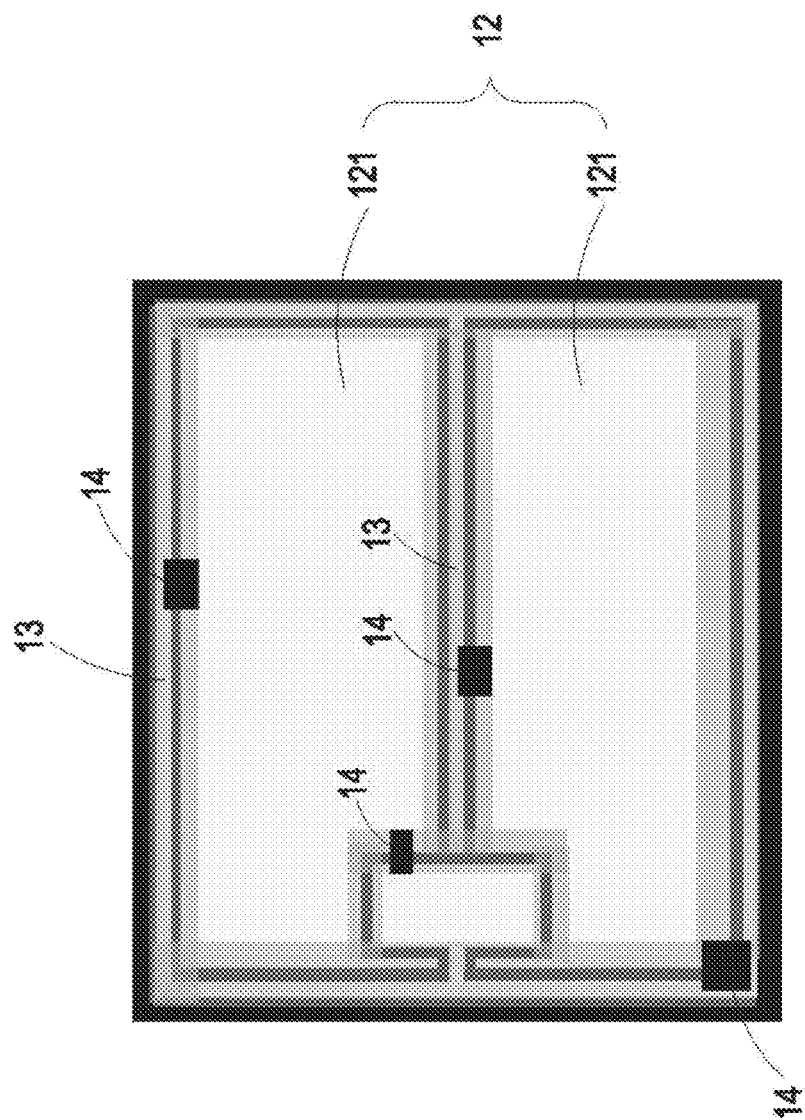
FIG. 5 is a schematic top view of a structure of another embodiment of the semiconductor chip as shown in FIG. 2.

In some other embodiments, the first end 12 includes a plurality of first bonding pad 121, and the third end 13 includes a second bonding pad 131 and a second interconnect line 132. The connecting portion 14 may only partly fill in a gap between the first end 12 and the third end 13 on the first side 111 of the functional area 11. For example, the connecting portion 14 fills in a location of the semiconductor chip 1 with higher temperature than other areas. As shown in FIG. 5, the connecting portion 14 partly fills in a gap between the first bonding pad 121 and the second bonding pad 131 and a gap between the first bonding pad 121 and the second interconnect line 132, so that one or more connecting portions 14 can be flexibly disposed to reduce cost of the semiconductor chip 1. In some embodiments, as shown in FIGS. 4 and 5, the second end of the semiconductor chip is disposed on the second side 112 of the functional area 11.

Figure 6:
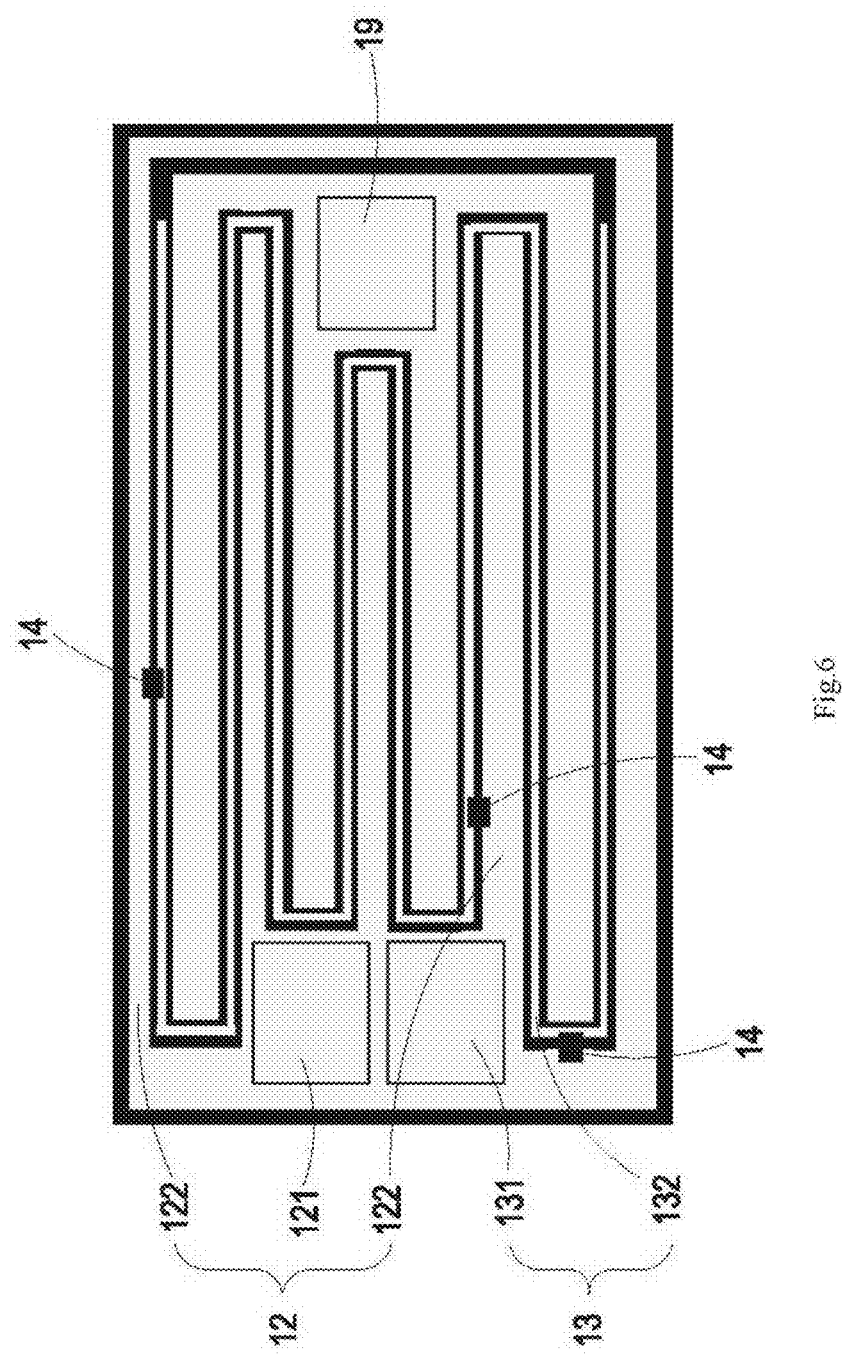
FIG. 6 is a schematic structural top view of a further embodiment of the semiconductor chip as shown in FIG. 2.

In some embodiments, the first end 12 includes a first bonding pad 121 and the first interconnect line 122, and the third end 13 includes a second bonding pad 131 and a second interconnect line 132, and the connecting portion 14 only partially fills in a gap between the first end 12 and the third end 13 on the first side 111 of the functional area 11, as shown in FIG. 6. The connecting portion 14 partly fills in a gap between the first bonding pad 121 and the second interconnect line and a gap between the first interconnect line 122 and the second interconnect line 132. In some embodiments, as shown in FIG. 6, the second end 19 of the semiconductor chip is disposed on the first side 111 of the functional area 11.

Figure 7:
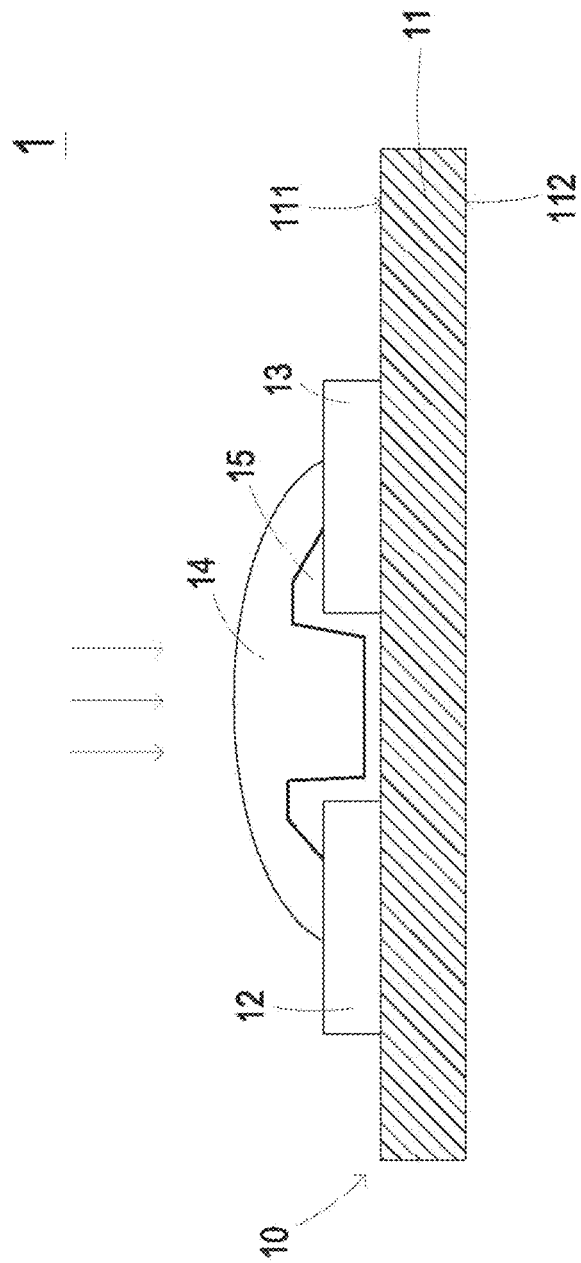
FIG. 7 is a schematic view of a cross-sectional structure of a semiconductor chip of a second embodiment of the present disclosure.
Figure 8:
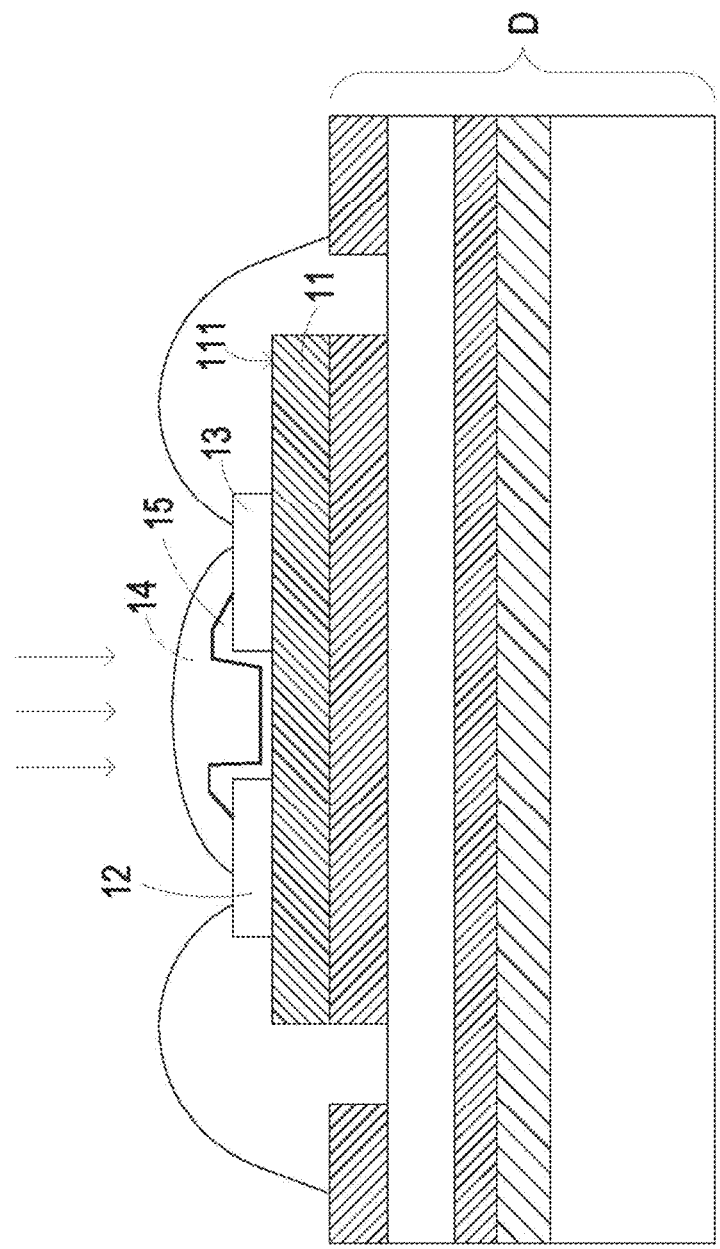
FIG. 8 is a schematic view of a cross-sectional structure of a semiconductor chip of a third embodiment of the present disclosure.

Referring to FIG. 7, a schematic view of a cross-sectional structure of a semiconductor chip of a second embodiment of the present disclosure is shown. In this embodiment, a first passivation layer 15 is disposed on the first side 111 of the functional area 11, and at least partly covers the first end 12 and a third end 13. The connecting portion 14 is formed on the first side 111 of the functional area 11 with a physical vapor deposition, a chemical vapor deposition, spin-on glass, printing or dot coating process, thereby forming the semiconductor chip 1, and the connecting portion 14 covers the first passivation layer 15. Referring to FIG. 8, a schematic view of a cross-sectional structure of a semiconductor chip of a third embodiment of the present disclosure is shown. In this embodiment, the semiconductor chip is firstly disposed on a package structure D, and then the connecting portion 14 is provided. The connecting portion 14 is formed on the first side 111 of the functional area 11 by processes, such as dot coating or printing, and the connecting portion 14 covers the first passivation layer 15. As can be seen, the connecting portion 14 of the semiconductor chip 1 of the present disclosure can be provided in a front end chip process or a back end packaging process, and the connecting portion 14 may be disposed after the first passivation layer 15 is disposed. Thus, the process for manufacturing the semiconductor chip 1 of the present disclosure is flexible, and difficulty of the process can be reduced.

Figure 9:
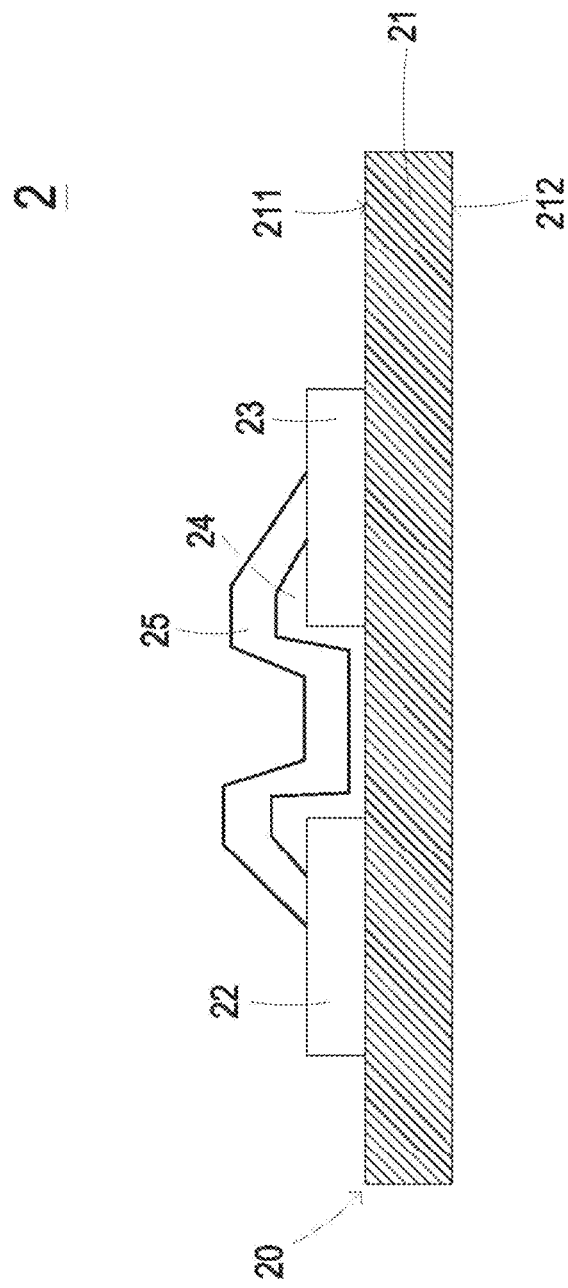
FIG. 9 is a schematic view of a cross-sectional structure of a semiconductor chip of a fourth embodiment of the present disclosure.

Referring to FIG. 9, a schematic view of a cross-sectional structure of a semiconductor chip of a fourth embodiment of the present disclosure is shown. As shown in the figure, the semiconductor chip 2 of the present embodiment includes a functional area 21, a first end 22, a third end 23, a connecting portion 24, and a second passivation layer 25, wherein the functional area 21 and the first end 22, the third end 23, and the connecting portion 24 of the semiconductor chip 2 are similar to the functional area 1, the first end 12, the third end 13, and the connecting portion 14 of the semiconductor chip 1 as shown in FIG. 2, respectively. Structure, actuation and function of the similar components will not be repeated here. Compared to the embodiment illustrated in FIG. 2, in the embodiment shown in FIG. 9, the connecting portion 24 of the semiconductor chip 2 is provided on the first side 211 of the functional area 21, and the second passivation layer 25 covers the connecting portion 24 to protect the connecting portion 24. The material or the like of the second passivation layer 25 may be the same as that of the first passivation layer 15.

Figure 10:
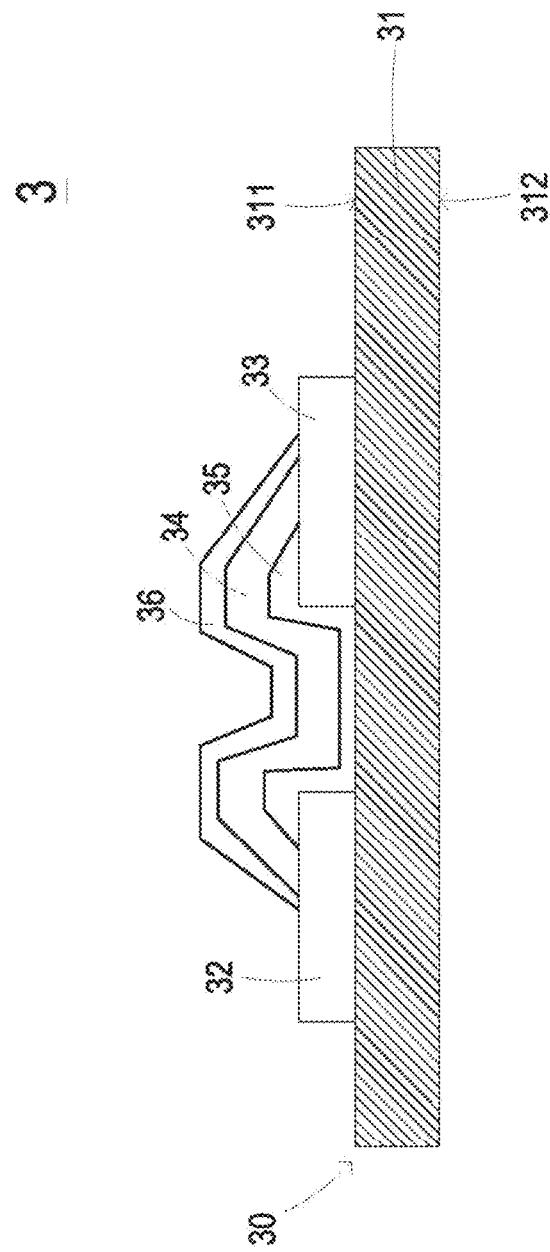
FIG. 10 is a schematic view of a cross-sectional structure of a semiconductor chip of a fifth embodiment of the present disclosure.

Referring to FIG. 10, a schematic view of a cross-sectional structure of a semiconductor chip of a fifth embodiment of the present disclosure is shown. As shown in the figure, the semiconductor chip 3 of the present embodiment includes a functional area 31, a first end 32, a third end 33, a connecting portion 34, and a first passivation layer 35, wherein the functional area 31, the first end 32, the third end 33, the connecting portion 34 and the first passivation layer 35 of the semiconductor chip 3 are similar to the functional area 11, the first end 12, the third end 13, the connecting portion 14 and the first passivation layer 15 of the semiconductor chip 1 as shown in FIG. 2, respectively. Structure, actuation and function of similar components will not be repeated here. Compared to the embodiment illustrated in FIG. 2, in the embodiment shown in FIG. 10, the semiconductor chip 3 further includes a second passivation layer 36, and the second passivation layer 36 covers the connecting portion 34 in order to protect the functional area 31 and the connecting portion 34, so that the semiconductor chip 3 may have a better protection capability. In some embodiments, the first passivation layer 35 may be, but not limited to, silicon dioxide ($SiO_2$), and the second passivation layer 36 may be, but not limited to, polyimide (PI). In other embodiments, the second passivation layer 36 is composed of a composite material, such as a composite layer of ethyl silicate (TEOS) and silicon nitride (SiN) having a good shape and a stress relief.

Figure 11:
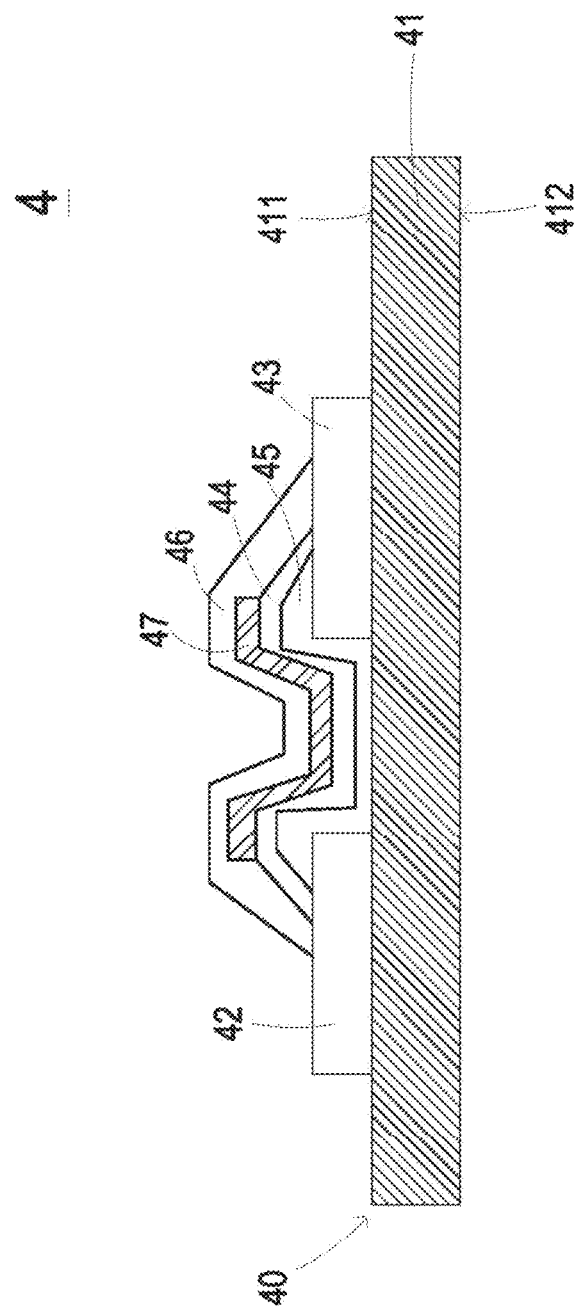
FIG. 11 is a schematic view of a cross-sectional structure of a semiconductor chip of a sixth embodiment of the present disclosure.

Referring to FIG. 11, a schematic view of a cross-sectional structure of a semiconductor chip of a sixth embodiment of the present disclosure is shown. As shown in the figure, the semiconductor chip 4 of the present embodiment includes a functional area 41, a first end 42, a third end 43, a connecting portion 44, and a first passivation layer 45, wherein the functional area 41, the first end 42, the third end 43, the connecting portion 44 and the first passivation layer 45 of the semiconductor chip 4 are similar to the functional area 11, the first end 12, the third end 13, the connecting portion 14 and the first passivation layer 15 of the semiconductor chip 1 shown in FIG. 2, respectively. Structure, actuation and function of the similar components will not be repeated here. Compared to the embodiment illustrated in FIG. 2, in the embodiment shown in FIG. 11, the semiconductor chip 4 further includes a second passivation layer 46 and a metal layer 47. The second passivation layer 46 covers the connecting portion 44 to protect the functional area 41 and the connecting portion 44, so that the semiconductor chip 4 may have a better protection capability. The metal layer 47 is disposed between the connecting portion 44 and the second passivation layer 46 and is in contact with the connecting portion 44. The metal layer 47 is not directly connected to the first end 42 and the third end 43 but connected to the first end 42 and the third end 43 through the connecting portion 44, such that the impedance between the first end 42 and the third end 43 is reduced. Thus, when the temperature of the connecting portion 44 rises to higher than the first temperature and the connecting portion 44 is in a conductive state, the short circuit can be achieved more quickly. Thus, the semiconductor chip 4 can be switched off more quickly. In some embodiments, the first passivation layer 45 may be, but not limited to, silicon dioxide (SiO2), and the second passivation layer 46 may be, but not limited to, polyimide (PI). In other embodiments, the second passivation layer 46 is composed of composite materials, such as a composite layer of ethyl silicate (TEOS) and silicon nitride (SiN) with a good shape and a stress relief. In some embodiments, the metal layer 47 can be formed by physical vapor deposition (PVD). The first passivation layer 45 and the second passivation layer 46 in this embodiment may be omitted separately or completely, and the present disclosure is not limited thereto.

Figure 12:
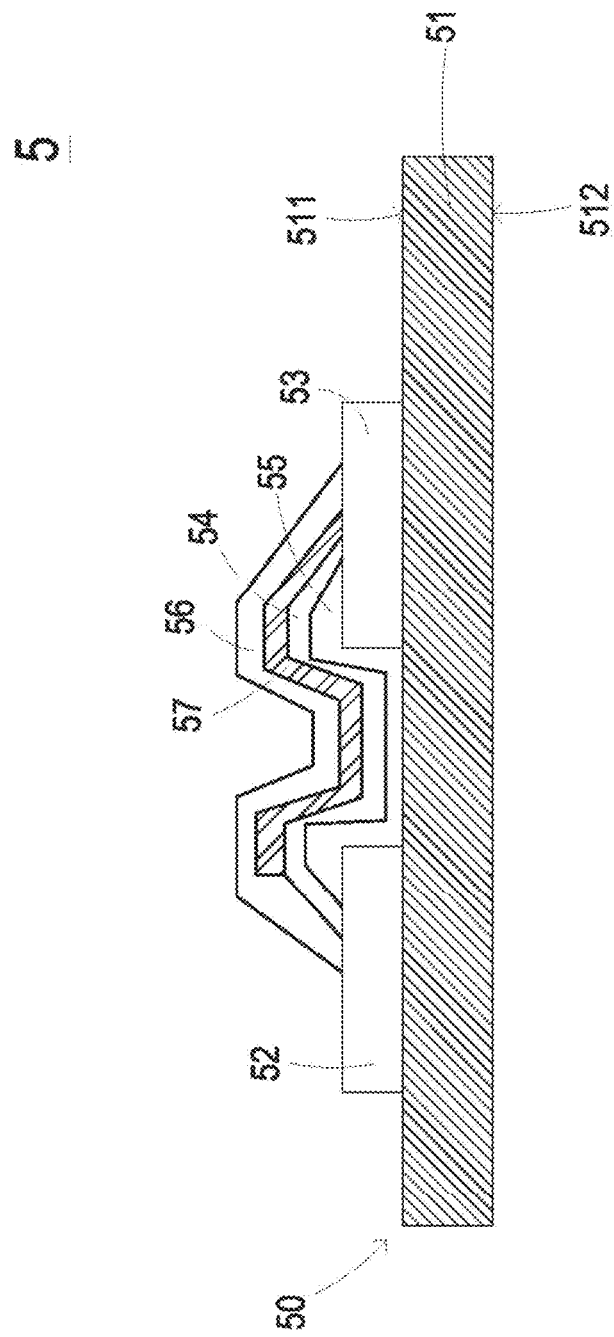
FIG. 12 is a schematic view of a cross-sectional structure of a semiconductor chip of a seventh embodiment of the present disclosure.

Referring to FIG. 12, a schematic view of a cross-sectional structure of a semiconductor chip of a seventh embodiment of the present disclosure is shown. As shown in the figure, the semiconductor chip 5 of the present embodiment includes a functional area 51, a first end 52, the third end 53, a connecting portion 54 and a first passivation layer 55, wherein the functional area 51, the first end 52, the third end 53, the connecting portion 54 and the first passivation layer 55 of the semiconductor chip 5 are similar to the functional area 11, the first end 12, the third end 13, the connecting portion 14 and the first passivation layer 15 of the semiconductor chip 1 shown in FIG. 2, respectively.

Structure, actuation and function of the similar components will not be repeated here. Compared to the embodiment illustrated in FIG. 2, in the embodiment shown in FIG. 12, a semiconductor chip 5 further includes a second passivation layer 56 and a metal layer 57. The second passivation layer 56 covers the connecting portion 54 to protect the functional area 51 and the connecting portion 54 so that the semiconductor chip 5 may have a better protection capability. The metal layer 57 is disposed between the connecting portion 54 and the second passivation layer 56 and is in contact with the connecting portion 54. In this embodiment, one end of the metal layer 57 is connected to the third end 53, and the other end of the metal layer 57 is connected to the first end 52 via the connecting portion, such that the impedance between the first end 52 and the third end 53 is reduced. Thus, when the temperature of the connecting portion 54 rises to be higher than the first temperature and the connecting portion 54 is in a conductive state, the short circuit can be achieved more quickly, and thus, the semiconductor chip 5 may be switched off more quickly. In some other embodiments, one end of the metal layer 57 is connected to the first end 52, and the other end of the metal layer 57 is connected to the third portion 53 via the connecting portion 54, such that the impedance between the first end 52 and the third end 53 is also reduced, and thus the semiconductor chip 5 is switched off more quickly. The end of the metal layer may be located at any place of the connecting portion. In some embodiments, the first passivation layer 55 may be, but not limited to, silicon dioxide ($SiO_2$), and the second passivation layer 56 may be, but not limited to, polyimide (PI). In other embodiments, the second passivation layer 56 is composed of composite materials, such as a composite layer of ethyl silicate (TEOS) and silicon nitride (SiN) with good shape and stress relief. In some embodiments, the metal layer 57 can be formed by physical vapor deposition (PVD). The first passivation layer 55 and the second passivation layer 56 in this embodiment may be omitted separately or completely, and the present disclosure is not limited thereto. The metal layer in the embodiments of the present disclosure is disposed in contact with the connecting portion. The word contact here includes direct contact and indirect contact by other conductive materials, and partial contact is also allowable. The metal layer may be disposed between the connecting portion and the second passivation layer, or between the connecting portion and the first passivation layer, or both above. If the first passivation layer and/or the second passivation layer are omitted, a metal layer may also be provided to at least partially contact the connecting portion. The metal layer may also be divided into multiple sections and multiple layers, and the present disclosure is not limited thereto.

Figure 13:
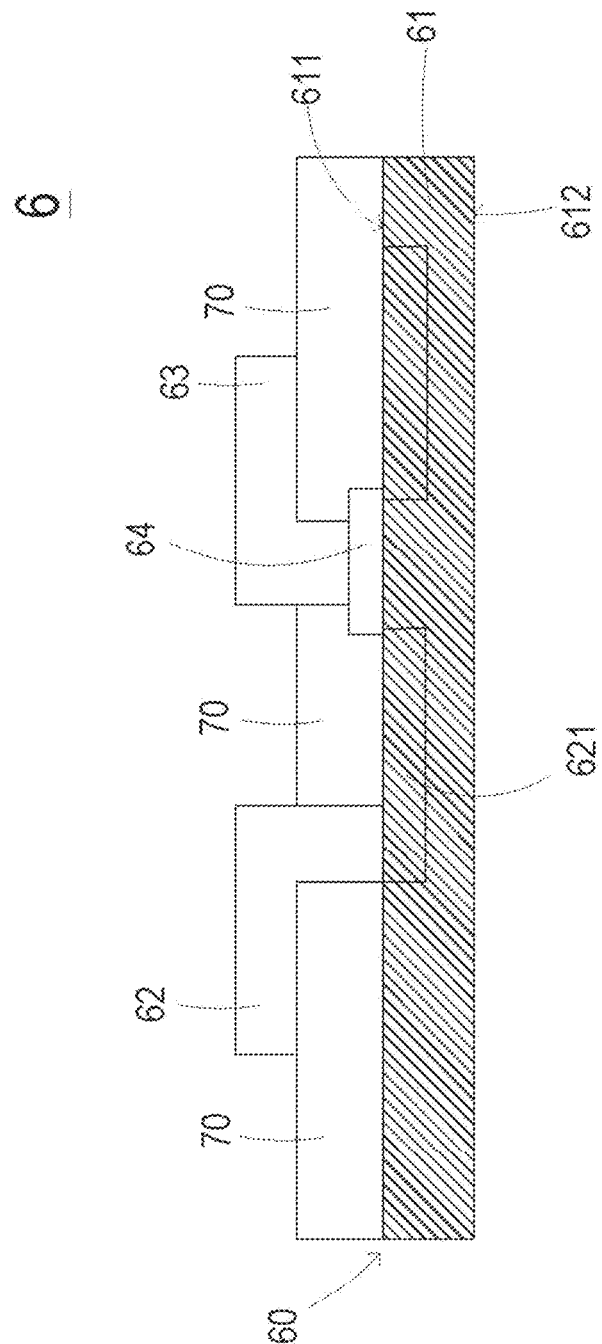
FIG. 13 is a schematic view of a cross-sectional structure of a semiconductor chip of an eighth embodiment of the present disclosure.

Referring to FIG. 13, a schematic view of a cross-sectional structure of a semiconductor chip of an eighth embodiment of the present disclosure is shown. As shown in the figure, the semiconductor chip 6 of this embodiment includes a functional area 61, first end 62, a third end 63 and a polysilicon 64, but a second end is not shown. The functional area 61, the first end 62 and the third end 63 of the semiconductor chip 6 are similar to the functional area 11, the first end 12 and the third end 13 of the semiconductor chip 1 as shown in FIG. 2, respectively. Structure, actuation and function of the similar components will not be repeated here. Compared to the embodiment illustrated in FIG. 2, in the embodiment of FIG. 13, insulating medium 70 is provided between the metal wirings connecting cells of the third end (e.g., gate of the MOSFET) and a first end (e.g., source of the MOSFET) of the semiconductor chip 6 such as a MOSFET. The connecting portion may be disposed inside the insulating medium 70 to connect the first end 62 and the third end 63 (e.g., gate of the MOSFET).

In other embodiments, for the semiconductor chip as shown in FIG. 13, the connecting portion may not be disposed in the insulating layer 70, but on the insulating layer 70, and disposed between the first end 62 and the third end 63. Since the insulating layer 70 is disposed on the first side 611 of the functional area 61, the connecting portion disposed on the insulating layer 70 is also considered to be disposed on the first side 611 of the functional area 61, which is not limited to direct contact or indirect contact.

Figure 14:
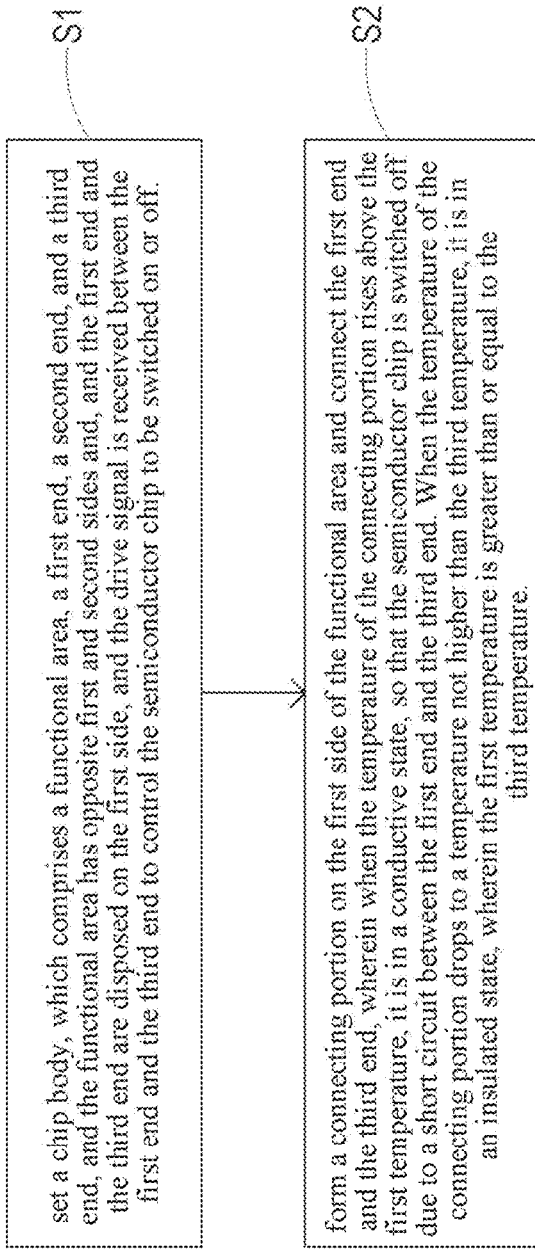
FIG. 14 is a schematic flow chart of a method of the semiconductor chip as shown in FIG. 2.

Referring to FIG. 14, which is a schematic flow chart of the method of the semiconductor chip as shown in FIG. 2. First, a step S1 is performed to set the chip body 10, which includes a functional area 11, a first end 12, a second end, and a third end 13. The functional area 11 has a first 111 and a second side 112 opposite to each other, and the first end 12 and the third end 13 are disposed on the first side 111. The drive signal is received between the first end 12 and the third end 13 to control the semiconductor chip 1 to be switched on or off. Next, a step S2 is performed to form a connecting portion 14 on the first side 111 of the functional area 11 and connect the first end 12 and the third end 13. When the temperature of the connecting portion 14 rises above the first temperature the connecting portion 14 is in a conductive state so that the semiconductor chip 1 is switched off due to the short circuit between the first end 12 and the third end 13. When the temperature of the connecting portion 14 drops to a temperature not higher than the third temperature, the connecting portion 14 is in an insulating state, wherein the first temperature is higher than or equal to the third temperature. The above method may also be applied to other embodiments of the present disclosure, and thus will not be described herein.

Figure 15:
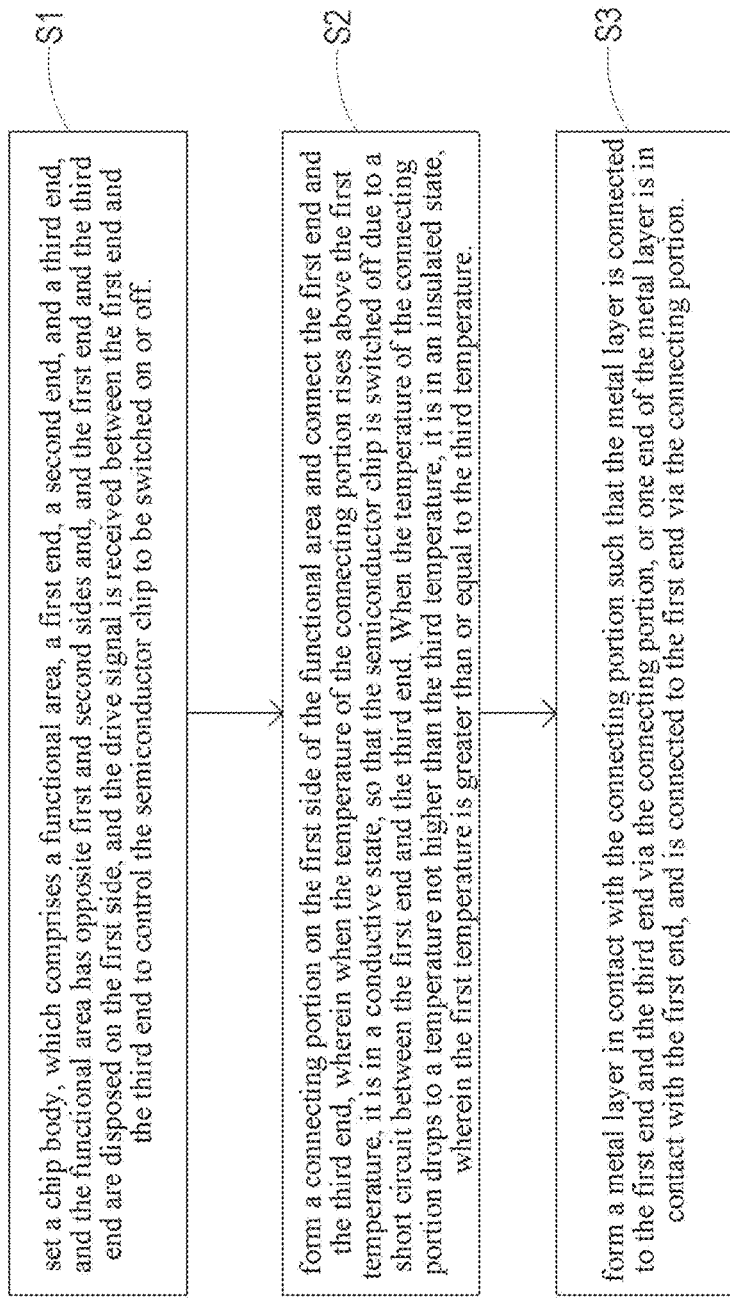
FIG. 15 is a schematic flow chart of a method of the semiconductor chip as shown in FIG. 11.

Referring to FIG. 15, which is a schematic flow chart of the method of the semiconductor chip shown in FIG. 11. First, the step S1 is performed to set the chip body 40, which includes a functional area 41, a first end 42, a second end, and a third end 43. The functional area 41 has a first side 411 and second side 412 opposite to each other, and the first end 42 and the third end 43 are disposed on the first side 411. The drive signal is received between the first end 42 and the third end 43 to control the semiconductor chip 1 to be switched on or off. Next, the step S2 is performed to form a connecting portion 44 on the first side 411 of the functional area 41 and connects the first end 42 and the third end 43. When the temperature of the connecting portion 44 rises above the first temperature, the connecting portion 44 is in a conductive state so that the semiconductor chip 1 is switched off due to a short circuit between the first end 42 and the third end 43. When the temperature of the connecting portion 44 drops to a temperature not higher than the third temperature, the connecting portion 44 is in an insulated state, wherein the first temperature is higher than or equal to the third temperature. Next, a step S3 is performed to form the metal layer 47 in contact with the connecting portion 44 such that the metal layer 47 is connected to the first end 42 and the third end 43 via the connecting portion 44. For example, one end of the metal layer 47 is in contact with the first end 42 and the other end of the metal layer 47 is connected to the third end 43 via the connecting portion 44, or one end of the metal layer 47 is in contact with the third end 43, and the other end of the metal layer 47 is connected to the first end 42 via the connecting portion 44. The end of the metal layer may be located at any place of connecting portion. The above method may also be applied to other embodiments of the present disclosure, and thus will not be described herein. In some embodiments, order of step S2 and step S3 may be changed or S2 and S3 are completed at the same time, and the present disclosure is not limited thereto.

As can be seen, when the temperature of the connecting portion of the semiconductor chip of the present disclosure rises to be higher than the first temperature, the semiconductor chip is in a conductive state, and when the temperature of the connecting portion drops to no higher than the first temperature, the semiconductor chip is in an insulated state. Thus, compared to conventional semiconductor chip which cannot work properly after returning to the normal temperature, the semiconductor chip of the present disclosure, due to the state transformation of the connecting portion at different temperatures, may be automatically switched off at a high temperature to avoid further damage, and may be recovered after returning to the normal temperature, and thus the semiconductor chip of the present disclosure has a high practicability. In some embodiments, the connecting portion is switched between the insulating state and the conductive state due to the material characteristics of the connecting portion itself, thus, it is safe and reliable to protect the semiconductor chip by being switched off at a high temperature and returning to a normal operation at a low temperature depending on the material characteristics.

What is claimed is:

1. A semiconductor chip, comprising:
a semiconductor material area, having a first side and a second side which are opposite to each other;
a first terminal, being disposed on the first side;
a second terminal;
a third terminal, being disposed on the first side, wherein the semiconductor chip is switched on or off according to a drive signal received between the third terminal and the first terminal;
a connecting portion, being disposed on the first side of the semiconductor material area and being connected to the first terminal and the third terminal, wherein when a temperature rises above a first temperature, the connecting portion is in a conductive state, so that the semiconductor chip is switched off due to a short circuit between the first terminal and the third terminal, and when the temperature drops to no higher than a third temperature, the connecting portion is in an insulated state, wherein the first temperature is higher than or equal to the third temperature, and
the connecting portion is a low melting temperature glass.

2. The semiconductor chip according to claim 1, wherein the drive signal is a voltage.

3. The semiconductor chip according to claim 1, wherein the first terminal and the second terminal are input or output terminals.

4. The semiconductor chip according to claim 1, further comprising a metal wiring layer, wherein the first temperature is lower than a melting temperature of the metal wiring layer, and the first temperature is lower than a lowest temperature at which the semiconductor chip loses semiconductor characteristics.

5. The semiconductor chip according to claim 1, wherein the semiconductor chip works normally when the temperature of the semiconductor chip is lowered to a temperature that is not higher than a second temperature wherein the second temperature is lower than the first temperature.

6. The semiconductor chip according to claim 1, wherein the semiconductor chip is a metal oxide semiconductor field effect transistor, an insulated gate bipolar transistor, a high electron mobility transistor, or a bipolar junction transistor.

7. The semiconductor chip according to claim 1, further comprising a first passivation layer, wherein the first passivation layer is disposed on the first side of the semiconductor material area, and the connecting portion covers the first passivation layer.

8. The semiconductor chip according to claim 7, further comprising a second passivation layer that covers the connecting portion.

9. The semiconductor chip according to claim 8, further comprising a metal layer, wherein the metal layer is disposed between the connecting portion and the second passivation layer is in contact with the connecting portion.

10. The semiconductor chip according to claim 1, further comprising a second passivation layer that covers the connecting portion.

11. The semiconductor chip according to claim 10, further comprising a metal layer, wherein the metal layer is disposed between the connecting portion and the second passivation layer and is in contact with the connecting portion.

12. The semiconductor chip according to claim 1, wherein a material of the semiconductor chip is silicon carbide or gallium nitride.

13. The semiconductor chip according to claim 1, further comprising a metal layer, wherein the metal layer is in contact with the connecting portion.

* * * * *